United States Patent
Guglielmi et al.

(10) Patent No.: US 11,101,076 B2
(45) Date of Patent: Aug. 24, 2021

(54) CAPACITOR FOR RESONANT CIRCUITS IN POWER APPLICATIONS

(71) Applicant: POLITECNICO DI TORINO, Turin (IT)

(72) Inventors: Paolo Guglielmi, Turin (IT); Fabio Freschi, Turin (IT); Vincenzo Cirimele, Verbicaro (IT)

(73) Assignee: Politecnico Di Torino, Turin (IT)

( * ) Notice: Subject to any disclaimer, the term of this patent is extended or adjusted under 35 U.S.C. 154(b) by 0 days.

(21) Appl. No.: 16/495,963

(22) PCT Filed: Mar. 21, 2018

(86) PCT No.: PCT/IB2018/051889
§ 371 (c)(1),
(2) Date: Sep. 20, 2019

(87) PCT Pub. No.: WO2018/172949
PCT Pub. Date: Sep. 27, 2018

(65) Prior Publication Data
US 2020/0143993 A1   May 7, 2020

(30) Foreign Application Priority Data
Mar. 23, 2017   (IT) .......................... 102017000032290

(51) Int. Cl.
*H01G 4/33*     (2006.01)
*H01G 4/224*    (2006.01)
(Continued)

(52) U.S. Cl.
CPC ............. *H01G 4/33* (2013.01); *H01G 4/1209* (2013.01); *H01G 4/14* (2013.01); *H01G 4/224* (2013.01); *H05K 1/162* (2013.01); *H02J 50/12* (2016.02)

(58) Field of Classification Search
CPC .......... H01G 4/33; H01G 4/1209; H01G 4/14; H01G 4/224; H05K 1/162
See application file for complete search history.

(56) References Cited

U.S. PATENT DOCUMENTS 3,484,664 A * 12/1969 Liddicoat ................. H01G 4/22
                                                              361/314
3,649,892 A    3/1972 Booe
(Continued)

FOREIGN PATENT DOCUMENTS

JP    H02-290008         11/1992
JP    S63-137408 A       6/1998
JP    2007201271 A   *   8/2007

OTHER PUBLICATIONS

International Search Report dated Jul. 20, 2018, issued in PCT Application No. PCT/IB2018/051889, filed Mar. 21, 2018.
(Continued)

*Primary Examiner* — David M Sinclair
(74) *Attorney, Agent, or Firm* — Workman Nydegger (57) ABSTRACT

A capacitive element is manufactured by using the multilayer printed circuit board technology. The body of the element includes a layer of dielectric material interposed between two layers of conductive material arranged on opposite sides of the layer of dielectric material. Each layer of conductive material is in turn covered, on its free side, with an external covering layer. The material for making the layer of dielectric material is chosen among materials having: —a dielectric permeability $\varepsilon_r > 1$, —a dielectric rigidity $k > 100$ kV/mm, and —a loss figure $Df \leq 0.002$. Furthermore, the dimensions of the layer of dielectric material are greater than the dimensions of the layers of conductive material, so as to limit the edge effects that might cause discharge phenomena and make the capacitive element flexible.

25 Claims, 6 Drawing Sheets

(51) Int. Cl.
*H01G 4/12* (2006.01)
*H01G 4/14* (2006.01)
*H05K 1/16* (2006.01)
*H02J 50/12* (2016.01)

(56) References Cited

U.S. PATENT DOCUMENTS

| | | | | |
|---|---|---|---|---|
| 4,323,948 A | * | 4/1982 | Mercier | H01G 4/22 361/303 |
| 6,114,015 A | * | 9/2000 | Fillion | H05K 1/162 428/192 |
| 2002/0145845 A1 | * | 10/2002 | Hunt | H01G 4/085 361/303 |
| 2006/0223226 A1 | * | 10/2006 | Guzek | H01G 4/33 438/106 |
| 2019/0215963 A1 | * | 7/2019 | Akahoshi | H01G 4/224 |

OTHER PUBLICATIONS

Written Opinion dated Jul. 20, 2018, issued in PCT Application No. PCT/IB2018/051889, filed Mar. 21, 2018.
L. I. Berger, *Dielectric Strength of Insulation Materials*, CRC Handbook of Chemistry and Physics, Jan. 1, 2007, pp. 15-46, XP002450381.
Specialchem: *Dielectric Constant Polymers*, Apr. 6, 2013, XP055445805, pp. 2, https://omnexus.specialchem.com/polymer-properties/properties/dielectric-constant?as_qdr=y15.
Specialchem: *Dissipation/Power Factor Measurement*, Apr. 6, 2013, XP055445796, pp. 2, https://omnexus.specialchem.com.polymer-properties/properties/dissipation-factor.
International Preliminary Report on Patentability dated Sep. 24, 2019, issued in PCT Application No. PCT/IB2018/051889, filed Mar. 21, 2018.

* cited by examiner

CAPACITOR FOR RESONANT CIRCUITS IN POWER APPLICATIONS

FIELD OF INVENTION

The present invention relates to techniques for manufacturing capacitors, and in particular for manufacturing capacitors for resonant circuits in power applications.

More in detail, the invention can be employed in all industrial applications that require the use of highly inductive loads made resonant by capacitive compensation.

Some classic application examples include all processes related to heating, welding, hardening and melting by electromagnetic induction.

One application that is naturally addressed by the invention concerns inductive recharging systems for electric vehicles/systems, whether moving or stationary, which require the use of compensation/resonance capacitors both for the transmitting coil installed on the ground and for the receiving coil installed aboard the vehicle/system.

More in detail, the invention relates to a solution for manufacturing capacitors for medium-voltage, high-frequency and high-current industrial applications.

BACKGROUND ART

Industrial applications that make use of resonant loads are characterized by the use of components having ohmic-inductive characteristics, typically called inductors, which are employed in order to create magnetic fields at frequencies ranging from tens to hundreds of kilohertz (kHz).

In applications such as induction welding, hardening and reheating, a magnetic field is used as a means for transferring power towards a metallic object. The magnetic field hitting the object is created and suitably directed by means of an inductor (L).

The high impedance value of the inductors at the high electric frequencies employed requires the use of compensation capacitors in order to be able to increase the power that can actually be transferred to the object. This compensation also increases the efficiency of the transfer from the source, which typically consists of an electronic power converter.

In applications for inductive recharge of electric vehicles, the inductor consists of a coil, referred to as transmitting coil, installed on the ground or, more generally, externally to and at a distance from the vehicle, which coil is used in order to create a magnetic field.

This magnetic field induces a voltage in a secondary coil, referred to as receiving coil, which is positioned aboard the vehicle.

Through magnetic induction on the receiving coil, it is possible to transfer electric energy to the vehicle without the need for physical contact between the source, located outside the vehicle, and the vehicle itself.

In inductive power transfer applications, both coils, i.e. the transmitting and receiving coils, are conveniently compensated by means of capacitors (C) connected in series and/or in parallel.

This compensation increases the capacity of the power transfer from the source to the vehicle, while also allowing the use of power electronics switching techniques that provide reduced switching and conduction losses, thereby improving the power transfer efficiency.

In all of the above-mentioned applications, the capacitors are chosen in such a way as to resonate with the inductor at a given frequency imposed by the power electronics supplying power to the system. The coil-capacitor system (LC) thus becomes a resonant system. Such frequency may be set to an exact value or remain variable, as is the case in most reheating and hardening applications.

The typical distance between the primary coil (transmitting coil or inductor) and the receiving coil (receiving object or metal object) ranges between one centimeter and ten centimeters.

Due to the distances involved, the magnetic coupling between the two parts of the system is less than 50%.

In such coupling conditions, the resonance of the coil-capacitor system results in a considerable increase in the voltage across the terminals of these two elements.

The voltage across the compensation capacitor may become extremely high, reaching values within the medium-voltage range (tens of kV).

By way of example, when the capacitor is connected in series to the inductor, the voltage across the capacitor will have values typically comprised between ten and a hundred times the source voltage.

The capacities of interest in the applications addressed by the invention range between a few nanofarads and hundreds of nanofarads.

The different types of capacitors currently in use in such applications cannot always tolerate voltages higher than one or two kilovolts (kV).

Therefore, in order to use capacitors among those currently available on the market, it is necessary to create banks of multiple capacitors connected in series and in parallel for the purpose of obtaining an object having the desired capacity value and capable of tolerating the voltage involved.

The capacitors currently available on the market are bulky, massive and heavy. The thermal characteristics resulting from these physical features are such as to often require the use of liquid-cooling systems, leading to a more complex mechanical structure of the resonator.

Typical currents ranging from tens to hundreds of amperes are not an important limitation for the capacitors taken into account.

At present, the capacitors typically employed in the applications addressed by this invention are film capacitors (which utilize polyester or polypropylene as a dielectric material between the conductive layers) and mica capacitors.

The voltage value tolerated by the capacitors is dependent on the frequency of the current flowing in the circuit in which they have been inserted. While for mica capacitors such voltage is stable up to hundreds of kilohertz, for film capacitors the tolerable voltage value is as low as a few hundreds of volts for frequencies higher than ten kilohertz.

Such low tolerated voltage values require that capacitor batteries be resorted to, resulting in higher costs, greater dimensions, more complex connections and increased complexity of the heat sinking systems.

On top of this, current capacitors are also characterized by low tolerance as concerns the capacity value. Typical tolerances are approx. 20%, but may be as low as 5% for particularly accurate or selectable implementations, which are even more costly.

The attainment of reliable capacity values, i.e. with low tolerance relative to the nominal value, allows the power electronics to operate at the optimal resonance points of the system, in compliance with the design specifications. This is advantageous in terms of maximization of the power transferred to the object hit by the magnetic field (inductive heating applications) or maximization of the power transferred to the receiving coil, especially in inductive power transfer applications aimed at ensuring interoperability of different transmitters and receivers calibrated on the same frequency.

This benefit will affects the efficiency of the converter itself, which, by operating in known and stable resonance conditions, will work in conditions of minimized switching losses.

A need is therefore felt for providing solutions capable of overcoming the above-mentioned limitations: precision, small dimensions, high tolerated voltage and low cost.

OBJECT AND SUMMARY

The invention described herein adapts an existing technology, which is currently being used for the production of printed circuit boards, and applies it to the production of capacitors dedicated to high-power industrial applications that utilize LC resonators, i.e. all those systems that make use of an inductor L, the impedance of which is compensated for through resonance with a capacitive element C (whether consisting of a single component or multiple interconnected components).

Some typical examples of fields of application of LC resonators are: induction welding and heating, induction annealing and hardening of metals, inductive/wireless transmission of power.

The invention described herein allows the production of capacitors capable of tolerating voltages three or four times higher than those tolerated by the capacitors currently available on the market, with a precision in providing the rated capacity value of less than 2%.

A capacitor built in accordance with the technique proposed herein can be subjected to voltages of the order of ten kV and currents of the order of ten ampere, at frequencies of tens/hundreds of kHz.

The capacitors that can be obtained with this technique are extremely thin and have large surfaces, which is advantageous in terms of heat dissipation and space occupation.

Finally, the use of the multilayer printed circuit board technology ensures a cost reduction of approx. 70% for a single component and approx. 90% compared with the total cost of the minimum number of components currently employed in the applications of interest.

The invention presented herein allows overcoming the existing voltage limitations of the capacitors currently in use, avoiding the recourse to batteries of multiple capacitors connected in series and in parallel, thereby reducing the losses in the dielectric layers and offering smaller dimensions.

BRIEF DESCRIPTION OF THE DRAWINGS

Further features and advantages of the invention will be illustrated in the following detailed description, which is provided merely by way of non-limiting example with reference to the annexed drawings, wherein.

DETAILED DESCRIPTION

The following description will illustrate various specific details useful for a deep understanding of some examples of one or more embodiments. The embodiments may be implemented without one or more of such specific details or with other methods, components, materials, etc. In other cases, some known structures, materials or operations will not be shown or described in detail in order to avoid overshadowing various aspects of the embodiments. Any reference to "an embodiment" in this description will indicate that a particular configuration, structure or feature is comprised in at least one embodiment. Therefore, the phrase "in an embodiment" and other similar phrases, which may be present in different parts of this description, will not necessarily be all related to the same embodiment. Furthermore, any particular configuration, structure or feature may be combined in one or more embodiments as deemed appropriate.

The references below are therefore used only for simplicity's sake, and do not limit the protection scope or extension of the various embodiments.

The invention makes use of a technology that is innovative in the field of power capacitor production. Such a construction technology allows obtaining high accuracy in the capacity value as well as using materials offering better performance in terms of dielectric rigidity (tolerated voltage) and efficiency. In the drawings, the proportions between the thicknesses of the different layers are strongly amplified for the sole purpose of making the drawings themselves clearer. The typical total thickness of all layers is less than one millimeter.

Figure 1A:
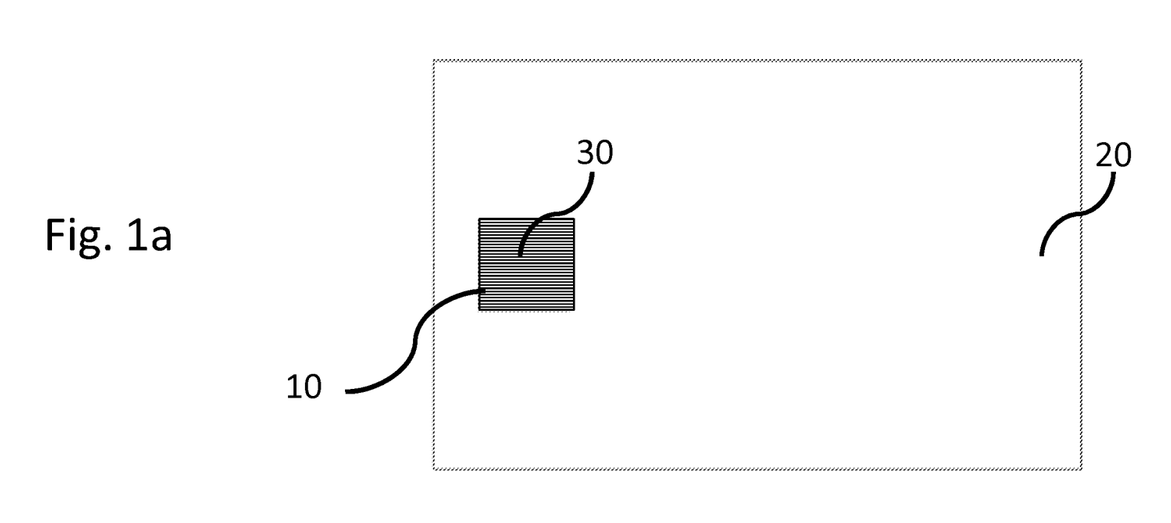
FIGS. 1a and 1b show the basic structure of the capacitor according to the present invention.
Figure 1B:
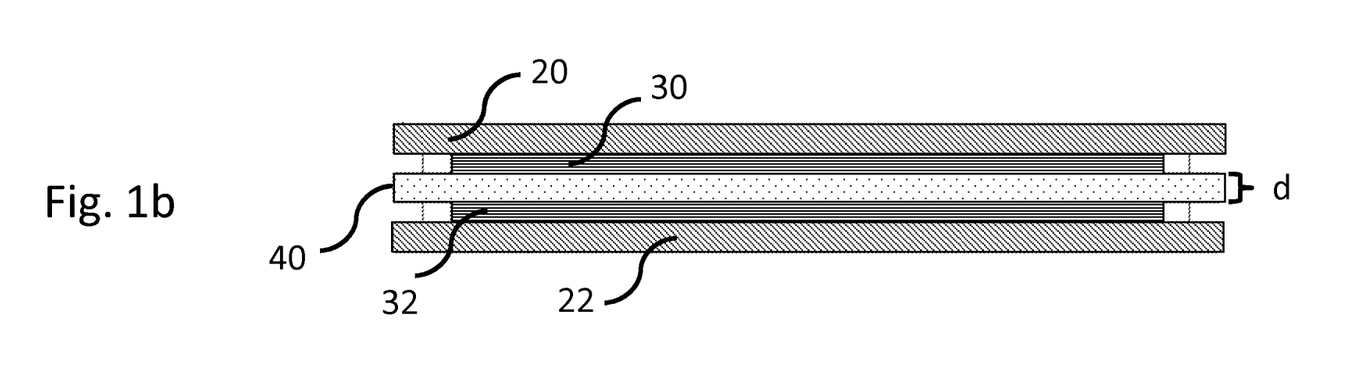

FIG. 1 shows the basic structure of the capacitor according to the present invention. The manufacturing technique proposed herein uses the technology currently employed for creating flexible multilayer printed circuit boards and not applied to the production of a capacitor with parallel flat faces.

The internal layers of the capacitor consist of a layer of dielectric material 40, on the opposite sides of which two layers of conductive material 30 and 32 are deposited.

It is important to underline that between the layers of conductive material 30 and 32 and the dielectric layer 40 there is no other material or adhesive layer. The creation of the alternated conductive/dielectric layers therefore occurs by deposition, not by glueing. Of course, deposition of the conductive material may be effected starting from the dielectric material or vice versa, since both deposition procedures are possible.

By way of example, the layers of conductive material 30 and 32 may be made of copper or another conductive material, including high-conductivity silicon. The external covering layers 20 and 22 are glued onto two layers of conductive material 30 and 32. One condition which is necessary for obtaining a component compliant with the specifications in terms of tolerable voltage is that the glueing operation must be carried out by using techniques ensuring the elimination of any residual air (or gas of any nature) from the interspaces that may be created at the contact edges between the conductive layer 30 and 32 and the external layer 20 and 22.

Such external layers 20 and 22 act as covers, i.e. protective layers against local discharge phenomena (corona effect) caused by the high electric field to which the component and the surrounding materials may be subject. These external layers 20 and 22 also act as protections against external electrochemical agents (humidity, dust) and make the final product mechanically stronger.

By way of example, the layers 20 and 22 can therefore be applied by using techniques such as hot pressing or vacuum glueing.

The capacity value obtained can be expressed with the classic formula for calculating the capacity between two parallel flat faces:

$$C = \varepsilon_0 \varepsilon_r \frac{S}{d}$$

where "$\varepsilon_0$" is the dielectric permeability of the vacuum, "$\varepsilon_r$" is the dielectric permeability of the dielectric material that constitutes the layer 40, "S" is the mutually facing area of the two layers of conductive material deposited on the sides of the dielectric layer, and "d" is the distance between them, i.e. the thickness of the dielectric material 40.

From this formula, one can deduce two fundamental characteristics for the materials that may be used for making the dielectric layer 40, i.e.:

dielectric permeability $\varepsilon_r > 1$ (typically $\varepsilon_r > 2$);
extremely small thickness of the dielectric layer 40 (typically d<0.1 mm).

The thickness of the suitable material depends on its properties in terms of dielectric rigidity, i.e. the maximum electric field value tolerated by the material before it reaches the electric discharge. The materials used for the application must have a very high dielectric rigidity "k":

dielectric rigidity k>100 kV/mm (typically k>250 kV/mm).

The dimensions of the dielectric layer 40 must exceed the dimensions of the layers of conductive material 30 and 32, so as to limit the edge effects (local increase in the electric field) that might cause discharge phenomena between the edges of the two conductive surfaces.

In several embodiments, the thickness of the external layer is chosen in such a way as to be at least three times greater than the thickness of the dielectric layer.

The material used for making the dielectric layer 40 must also have good properties in terms of losses, in relation to the variable electric field to which it is subjected.

The loss characteristics are often expressed as a parameter called loss figure or dissipation factor "Df".

The losses in the capacitor give rise to an equivalent resistive behaviour expressed as a parameter called equivalent series resistance, designated as "ESR".

The equivalent series resistance parameter ESR should be as low as possible, in order to ensure a behaviour of the component that is as close as possible to that of an ideal capacitor, wherein resistive phenomena are totally absent.

The capacity values obtained, the equivalent series resistance "ESR" and the loss figure "Df" are bound to the frequency of the application according to the following expression:

$$Df = \omega \cdot C \cdot ESR$$

where ω is the angular frequency (or pulsation) equal to $2*\pi*f$, where f is the electric frequency of the current flowing in the capacitor.

In the applications taken into account herein, the material should conveniently have a loss figure Df≤0.002.

In order to ensure such a loss figure "Df", the contiguous layers of dielectric material 40 and of conductive material 30 and 32 must be created by using techniques not requiring the use of any additional materials, i.e. such layers must be made to mechanically adhere to each other without using any kind of glue.

In general, the succession of conductive-dielectric-conductive layers can be created by using different techniques among those typically employed for creating film printed boards. Such techniques include, for example, photoresistive deposition, photoresistive removal, galvanic deposition and plasma enhanced chemical vapour deposition (PECVD).

Glueing techniques are avoided because the presence of glues/resins would add a layer of material having dielectric properties poorly compatible with the application. In particular, with reference to the characteristics of the materials typically used for creating multilayer circuits, the layer of glue/resin would have a higher loss figure Df and a lower dielectric rigidity than the materials suitable for the creation of the dielectric layer. As a main effect, the layer of glue/resin would imply increased losses and hence an increased ESR of the capacitor (approximately by a factor of 10 in comparison with the case with deposited conductive layer).

Different materials can be used for making the dielectric layer 40, including, for example, different polyamide films, some of which are typically used in the production of printed circuit boards, fluorinated ethylene propylene (FEP), and silicon oxide. It is essential that the materials used for making the dielectric layer 40, in addition to having the above-mentioned electric properties, also allow depositing the conductive material in the total absence of glues.

As regards the creation of the internal layers, all those technologies including intermediate steps of depositing the dielectric material on the surface of the conductive material may be equally employed, i.e. any technology allowing the physical making of the succession of layers 30, 40 and 32 without interposition of any intermediate material, i.e. with physical-mechanical continuity between the layers.

The external covering layers 20 and 22, or covers, of the capacitor must ensure protection of the conductive layers 30 and 32 against external agents and the absence of any discharge phenomenon, typically known as "corona" effect.

The corona effect occurs because of a local increase in the electric field, which increase is related to the edge effects between the two conductive layers. When the electric field gradient is such as to exceed the dielectric rigidity, e.g. of the air surrounding the component (approx. 3 kV/mm), the latter is ionized. Such ionization shows itself as a local discharge phenomenon at the edges of one or both the internal conductive layers. This discharge causes a quick deterioration of the external covering layers 20 and 22 and also of the dielectric layer 40, which will then break after only a few work cycles of the component, thus limiting the operating range of the latter in terms of voltage that can be tolerated by the component itself.

The corona effect can be triggered on the outer side of the external layers 20 and 22 and also in any interspaces possibly created within the interface to the conductive layers 30 and 32. In both cases, since it brings about local discharge phenomena, ionization will damage the nearby layer of dielectric material 40, leading to a rapid deterioration of the capacitor.

Figure 2:
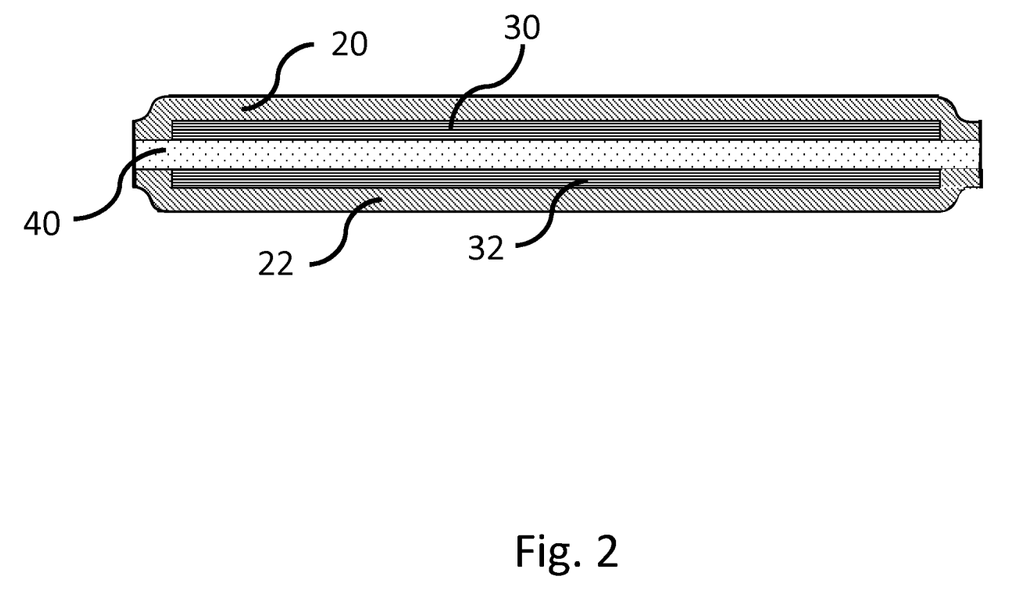
FIG. 2 shows an example of embodiment of the capacitor according to the present invention.

As shown in FIG. 2, the external covering layers 20 and 22 must perfectly adhere to the layers of conductive material 30 and 32, so as to ensure the absence of residual air in any interspaces.

The material used for the external covering layers, or covers, 20 and 22 must therefore ensure:
- perfect adhesion to the conductive layers 30,32 and to the dielectric layer 40;
- a thickness that will prevent ionization of the air layers around the capacitor; and
- a dielectric rigidity that will prevent ionization of the same dielectric material they are made of.

The dielectric rigidity of the material used for the external covering layers 20 and 22 must therefore be equal to or greater than that of the material used for the dielectric layer 40.

Particular attention must be paid to eliminating any sharp corners (to be understood as angles having a size of less than 45°) of the conductive surfaces, so as to avoid any phenomena of charge accumulation at the apexes. Such accumulated charges may also lead to a considerable local electric field increase, resulting in collapse of the dielectric material.

Thanks to the use of the technology for the production of printed circuit boards, this constraint can be complied with in an extremely accurate manner.

It should also be added that, in various embodiments, the capacitor manufactured by using the process and materials described herein is flexible. Another typical advantage of the capacitor made as described herein is the low value of self-inductance or parasitic inductance (ESL) of such elements. Said low self-inductance value is a direct consequence of the planar design of the object. The same cannot be said, for example, for film capacitors, which, since they typically have cylindrical shapes, show increased self-chaining of the magnetic field generated by the flow of electric current, resulting in higher ESL.

Figures 3A, 3B:
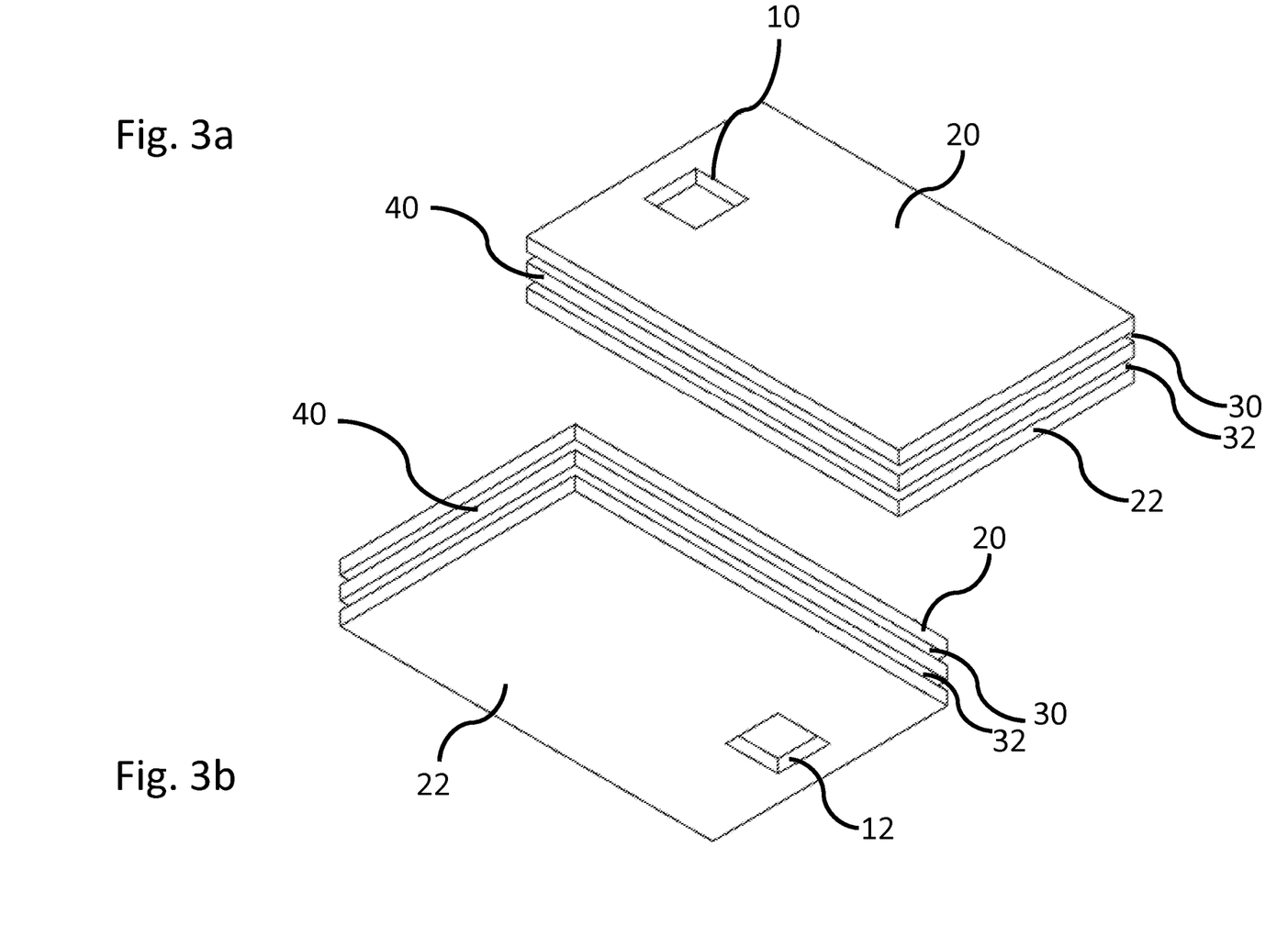
FIGS. 3a and 3b show, respectively, a top view and a bottom view of the capacitor according to the present invention.

As shown in FIGS. 1 and 3, the connections of the conductive layers 30 and 32 are effected by means of areas or patches 10 and 12 formed on the external covering layers 20 and 22. On such patches, by using another conductive material (including high-conductivity silicon), it is possible to glue or solder connection elements to the external circuitry.

In particular, patches are areas of the conductive layers 30 and 32 that are left uncovered by the external layer, or cover, 20 or 22. Therefore, a patch is a sort of mask created on the covering layer before it is glued onto the conductive layer.

In welding applications, it is assumed that the materials adopted in the manufacturing technique presented herein can tolerate operating temperatures "Tw" of a few hundreds degrees centigrade.

The maximum tolerable temperature or maximum operating temperature of the dielectric material 40 and of the external covering layers 20 and 22 must therefore ensure the condition Tw>200° C. (typically Tw>300° C.) to allow easy soldering of the connection points.

The connection points will have to be locally protected and insulated by means of suitable insulation systems to ensure the absence of the same phenomena already described with reference to the external covering layers 20 and 22.

In particular, the connections can be insulated by means of polyamide tapes and films, insulating lacquers, polyurethane-based foams, silicon-based gels and pastes, insulating sheaths, even in multiple layers and combinations thereof.

By way of example, in various embodiments it is possible to apply Kapton tape on the connection pin and protect the connection itself with heat-shrink tubing. The precision in obtaining the desired capacity value is dictated by three main parameters:
- tolerance on the thickness "d" of the dielectric layer 40;
- tolerance on the dielectric permeability "$\varepsilon_r$" of the material of the dielectric layer 40,
- tolerance on the alignment of the two mutually facing conductive surfaces 30 and 32.

Manufacturing the multilayer capacitor by using the technology for the production of printed circuit boards allows attaining levels of precision on the surfaces which can compensate for the errors deriving from the tolerances on the other two parameters. The final error can be reduced to values below 2% directly at the design stage.

The invention presented herein proves to be innovative compared to the technologies currently available on the market.

The invention applies to a field of application characterized by levels of frequency and voltage that no existing component can cover.

Implementing the invention will allow reducing the cost, size and complexity of compensation/resonance systems.

In particular, the production cost of the capacitors built by using the proposed technique can be reduced by a factor of approximately ten compared to mica capacitors. These latter components are, among existing components, those that cover the broadest range in terms of voltage and frequency.

The tolerable voltage levels, according to the characteristics of the materials and the proposed production process, allow overcoming the limitations suffered by the existing technologies.

The precision levels that can be achieved in the production process allow obtaining an object that is particularly suited to resonant circuits, wherein system performance is improved by the insertion of the capacitor in terms of process effectiveness and efficiency of the electronic power converters at a given switching frequency.

A further advantage is represented by the mechanical features of the usable materials.

Such materials have very good characteristics in terms of strength and flexibility, especially in comparison with the characteristics of mica, which is notoriously a very fragile material.

The thicknesses and areas obtained are advantageous in terms of cooling.

Figure 4:
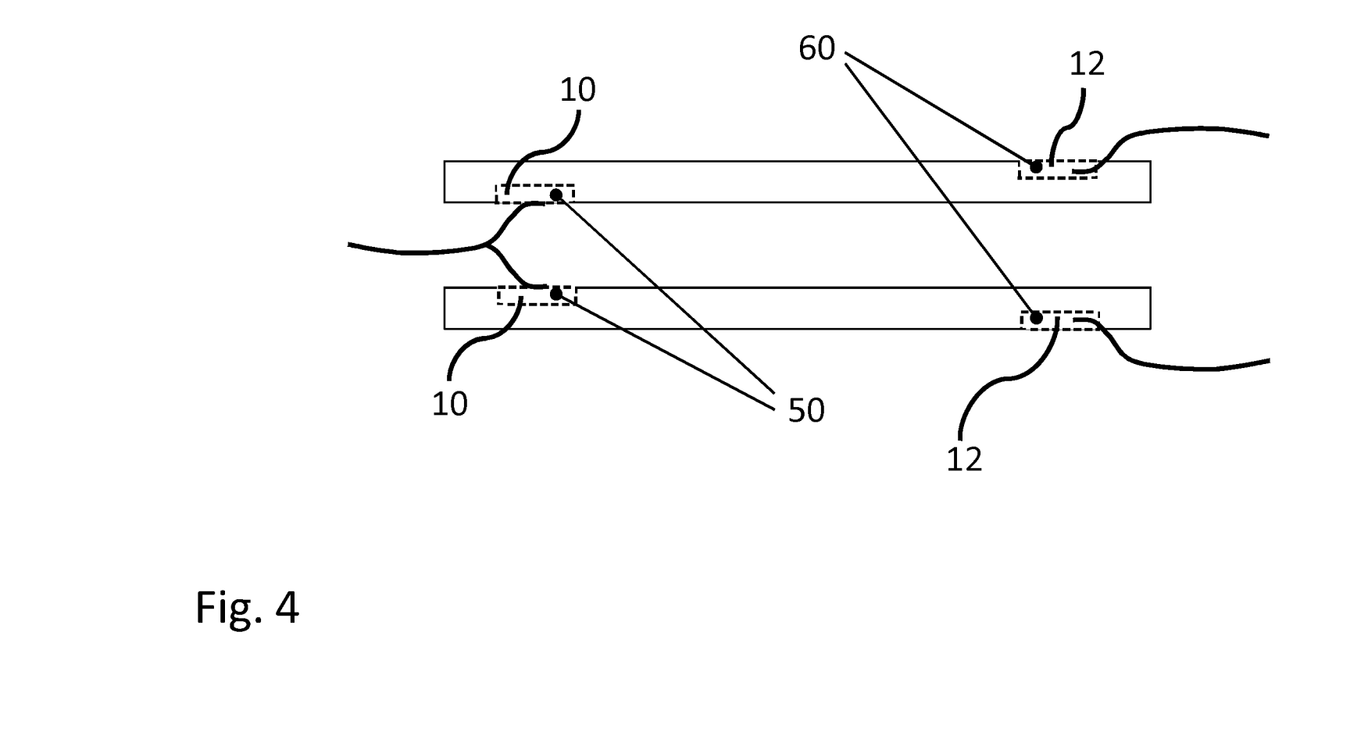
FIG. 4 shows one possible example of a parallel connection of multiple capacitors.

Unlike the capacitors currently in use, the capacitors made by using the techniques proposed herein have very low thermal capacities and resistances. This allows for simpler heat removal by means of classical passive methods (heat sinks), avoiding the recourse to more complex liquid-cooling systems. As shown in FIG. 4, multiple capacitors can be arranged in parallel by setting the individual patches 10 and 12 in front of each other and interposing the connection between the two external covering layers 20 and 22.

The parallel connection of multiple capacitors, obtained in accordance with the present recommendations, brings advantages in terms of electric safety. Such a spatial distribution of the components is characteristic of the manufactured object and cannot be found in any component currently available on the market. In FIG. 4, reference 50 indicates the high-potential connections, whereas 60 indicates the low-potential connections.

In various embodiments, there is a connection point at a potential much higher than that of a second connection point. In applications with "parallel" compensation, this voltage is equal to the output voltage of the power converter (typically ranging from hundreds of volts to one thousand volts, depending on the power of the system).

In applications with "series" compensation, one connection point will have a potential equal to the output voltage of the power converter, whereas a second point, connected to the inductor, will have a voltage ranging from hundreds to thousands of volts, depending on the power of the system.

In mixed compensation topologies (i.e. with a set of capacitors connected both in series and in parallel), voltages nevertheless remain at values comparable to the series and parallel topologies.

The method of connection indicated herein allows protecting the connection at higher potential, making it inaccessible from the outside, resulting in protection against undesired phenomena of outward capacitive coupling and discharge.

Figure 5A:
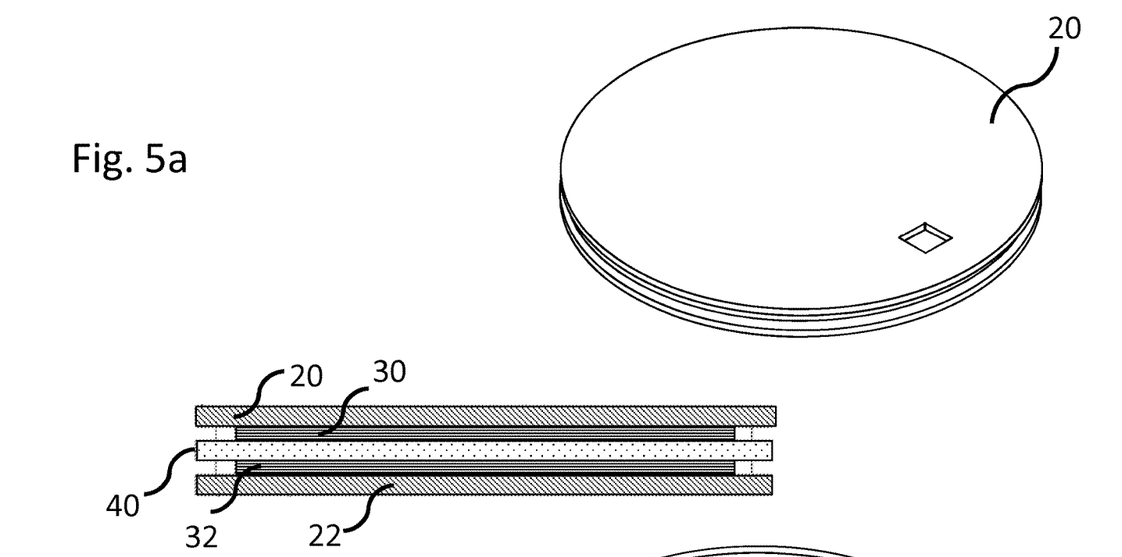
FIGS. 5a and 5b show, respectively, a top view and a bottom view of a variant of the capacitor according to the present invention.
Figure 5B:
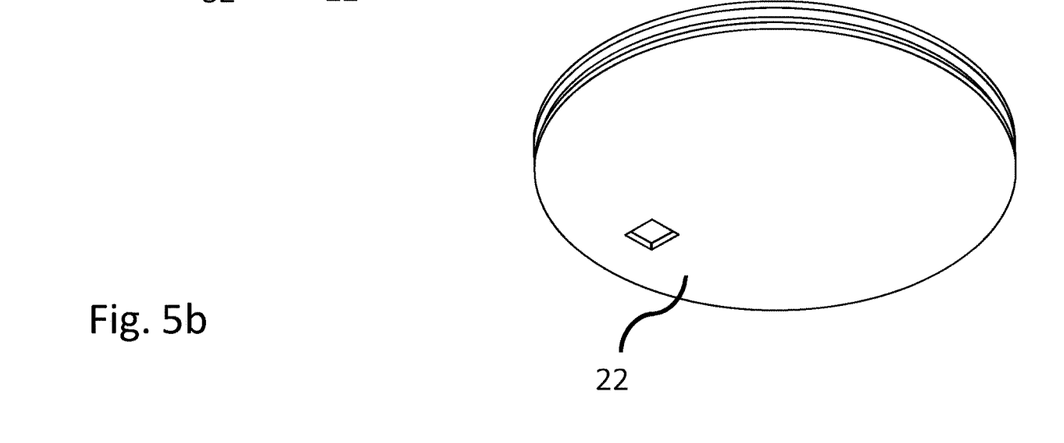

FIGS. 5a and 5b show a variant embodiment of the capacitor of FIG. 1, wherein said capacitor has a discoid shape. The layers that compose the capacitor are the same as those already described, the only difference being its shape, which is circular instead of rectangular. This embodiment is presented herein because it is particularly suitable for the creation of integrated coil-compensation capacitor objects in future inductive recharging systems, in which the magnetic structure of the coils is circular in shape.

The advantages mentioned below refer to the technologies used for manufacturing the capacitors currently available on the market and employed in applications for which the invention is proposed as an alternative.

Performance comparisons are indicated as order of magnitude or range of values.

Maximum (peak) voltage
Currently: 1.4-2.8 kV
Invention: >8 kV
Equivalent series resistance ESR (@100 kHz)
Currently: 0.35-1Ω
Invention: 0.25Ω-0.5Ω
Relative precision of the capacity value
Currently: 5-10%
Invention: <2%
Typical volume of the single component
Currently: ~10^2 cm3
Invention: ~10^-1 cm3
Unitary cost of the component
Currently: ~100 € per ten nF
Invention: ~10 € per ten nF The proposed invention applies to all industrial applications that utilize resonant LC circuits, such as induction hardening, reheating, melting and welding operations, induction cooking, induction heating.

The invention in question is particularly fit for all recent inductive/wireless high-power transmission technologies, e.g. applications for recharging electric vehicles, while it already presents itself as an essential component for industrial-scale development of current prototypes for mobile inductive recharging.

Finally, the invention can be employed in all those systems which require power supply and control of highly inductive loads through the adoption of resonant converters.

In the application naturally addressed by the invention, i.e. inductive recharging systems for electric vehicles, it is necessary to use compensation/resonance capacitors for the transmitting coil installed on the ground and for the receiving coil installed aboard the vehicle.

Figure 6:
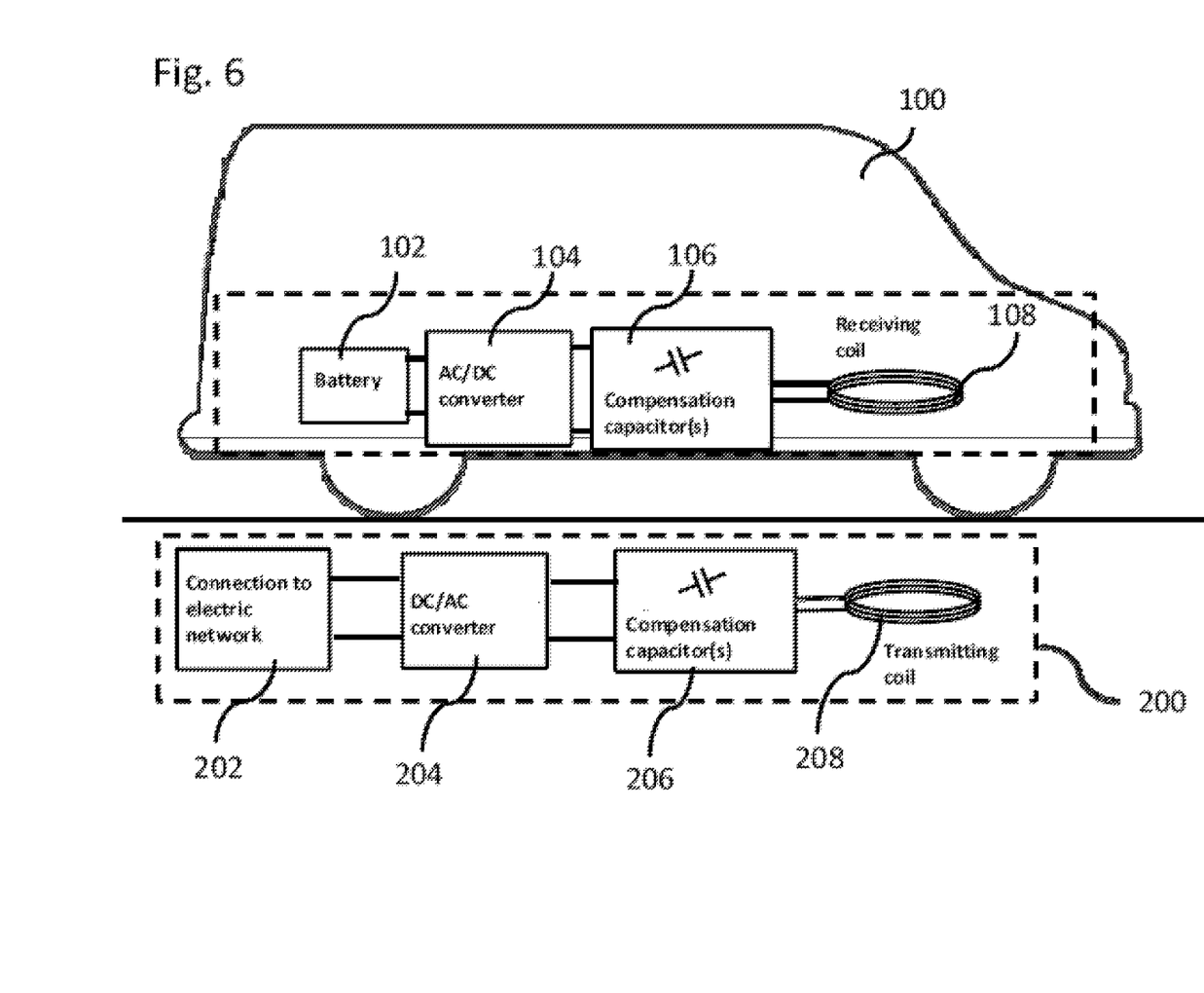
FIG. 6 shows one possible example of application of the capacitors according to the present invention.

With reference to FIG. 6, the recharge station (or the section of the recharge tract, for future mobile recharging applications) 200 is connected to the electric distribution network 202. The two coils, i.e. the transmitting coil 208 and the receiving coil 108, constitute two inductors mutually coupled through an air tract typically comprised between 10 and 30 cm.

The transmitting coil 208 is powered by an electronic power converter 204 that supplies high-frequency current, thus creating an alternating magnetic field.

This field is concatenated by the receiving coil 108, thus giving rise, through the electromagnetic induction phenomenon (Faraday's law), to transfer of electric energy. The electric current induced in the receiving coil 108 is then rectified by an AC/DC converter 104, which allows recharging and interfacing to the battery 102 installed aboard the vehicle 100.

The presence of the long air tract implies a poor magnetic coupling between the two coils 108 and 208. In order to cope with this coupling deficiency, it is necessary to raise the frequency of the current supplied to the system.

Depending on the technology of the static switches in use, the frequencies typically adopted range from ten to one hundred kilohertz. For such frequencies, the very impedance of the coils 108 and 208 represents a strong limitation to power transfer. For these reasons, the capacitors 206 and 106, called compensation capacitors, are resorted to, which, when connected to the inductors and selected in such a way as to have a single resonance frequency for the whole system, can compensate for the impedance of the inductors. The compensation effect, which causes the system to become a resonant system, brings numerous benefits. The installation of the capacitor(s) 106 aboard the vehicle allows maximizing the power transfer. The capacitor(s) 206 connected to the transmitting coil 208, by compensating for reactive phenomena, allows reducing the nominal power of the DC/AC converter 204, which must supply a purely active power equal to the power transferred to the battery 102 except for any losses. From the power electronics viewpoint, operating in resonance conditions allows the adoption of so-called soft switching techniques, i.e. switching ideally occurring without any losses, with great benefits in terms of overall efficiency of the system.

Of course, without prejudice to the principle of the invention, the forms of embodiment and the implementation details may be extensively varied from those described and illustrated herein merely by way of non-limiting example, without however departing from the protection scope of the present invention as set out in the appended claims.

The invention claimed is:

1. A capacitive element manufactured by using the multilayer printed circuit board technology, wherein the body of the element comprises a layer of dielectric material interposed between two layers of conductive material arranged on opposite sides of said layer of dielectric material, wherein each layer of conductive material is in turn covered, on its free side, with an external covering layer; the material for making said layer of dielectric material is chosen among materials having:

a dielectric permeability εr>1, a dielectric rigidity k>100 kV/mm, and a loss figure Df≤0.002, and wherein the dimensions of said layer of dielectric material are greater than the dimensions of said layers of conductive material, so as to limit the edge effects that might cause discharge phenomena and make said capacitive element flexible, further wherein the capacitive element is configured to have a maximum peak voltage of >8 kV.

2. The capacitive element according to claim 1, wherein said layer of dielectric material is chosen among materials having a dielectric permeability εr>2.

3. The capacitive element according to claim 1, wherein said layer of dielectric material is chosen among materials having a dielectric rigidity k>250 kV/mm.

4. The capacitive element according to claim 1, wherein said layer of dielectric material is chosen among a polyamide film, a fluorinated ethylene propylene (FEP) film and silicon oxide.

5. The capacitive element according to claim 1, wherein said layer of dielectric material is chosen among materials that allow depositing the conductive material for making said layers of conductive material without requiring the use of glues.

6. The capacitive element according to claim 1, wherein said external covering layers adhere perfectly to said layers of conductive material, so as to ensure that there will be no residual air in any interspaces, thus preventing local discharge phenomena.

7. The capacitive element according to claim 1, wherein the material for said external covering layers is chosen in such a way as to ensure:
   perfect adhesion to the conductive layers and to the dielectric layer;
   a thickness that will prevent ionization of the air layers around the capacitive element; and
   a dielectric rigidity that will prevent local discharge phenomena from arising, which might lead to perforation of the dielectric material.

8. The capacitive element according to claim 7, wherein the dielectric rigidity of the material used for the external covering layers is equal to or greater than the dielectric rigidity of the material used for the dielectric layer.

9. The capacitive element according to claim 7, wherein the thickness of the material used for the external covering layers is greater than or equal to the thickness of the material used for the dielectric layer.

10. The capacitive element according to claim 1, wherein the connections of the conductive layers are effected by means of holes or patches formed on said external covering layers, whereon electric connection elements can be glued or soldered.

11. The capacitive element according to claim 1, wherein the operating temperature Tw of the materials of the layer of dielectric material and of the external covering layers is Tw>200° C.

12. The capacitive element according to claim 1, wherein the operating temperature Tw of the dielectric material and of the external covering layers is Tw>300° C.

13. The capacitive element according to claim 1, wherein the capacitive element has a discoid shape.

14. A method for manufacturing a capacitive element according to the multilayer printed circuit board technology, comprising the steps of:
   preparing a layer of dielectric material,
   forming two layers of conductive material on opposite sides of said layer of dielectric material,
   covering the free side of each layer of conductive material with an external covering layer,
   selecting the material for making said layer of dielectric material among materials having:
      a dielectric permeability εr>1,
      a dielectric rigidity k>100 kV/mm, and
      a loss figure Df≤0.002,
   and wherein said method comprises the steps of:
      selecting the dimensions of said layer of dielectric material in a manner such that they are greater than the dimensions of said layers of conductive material, so as to limit the edge effects that might cause discharge phenomena and to cause the capacitive element to have a peak voltage of >8 kV.

15. The method according to claim 14, wherein said method comprises the step of selecting the material for making said layer of dielectric material among materials having a dielectric permeability εr>2.

16. The method according to claim 14, wherein said method comprises the step of selecting the material for making said layer of dielectric material among materials having a dielectric rigidity k>250 kV/mm.

17. The method according to claim 14, wherein said method comprises the step of selecting the material for making said layer of dielectric material among a polyamide film and a fluorinated ethylene propylene (FEP) film.

18. The method according to claim 14, wherein said method comprises the step of selecting the material for making said layer of dielectric material among materials that allow depositing the conductive material for making said layers of conductive material without requiring the use of glues.

19. The method according to claim 14, wherein said method comprises the step of causing said external covering layers to perfectly adhere to said layers of conductive material, so as to ensure that where will be no residual air in any interspaces, thus preventing local discharge phenomena.

20. The method according to claim 14, wherein said method comprises the step of selecting the material for making said external covering layers in such a way as to ensure:
   perfect adhesion to the conductive layers and to the dielectric layer;
   a thickness that will prevent ionization of the air layers around the capacitive element; and
   a dielectric rigidity that will prevent the dielectric material from collapsing.

21. The method according to claim 20, wherein the dielectric rigidity of the material used for the external covering layers is selected to be equal to or greater than the dielectric rigidity of the material used for the dielectric layer.

22. The method according to claim 14, wherein said method comprises the step of prearranging connections of the conductive layers by forming areas or patches on said external covering layers, whereon connection elements can be glued or soldered.

23. The method according to claim 14, wherein said method comprises the step of selecting the materials of said layer of dielectric material and said external covering layers among materials having an operating temperature Tw>200° C.

24. The method according to claim 14, wherein said method comprises the step of selecting the materials of said layer of dielectric material and said external covering layers among materials having an operating temperature Tw>300° C.

25. A multilayer printed circuit board comprising a capacitive element manufactured by using the method according to claim 14.

\* \* \* \* \*